(12) United States Patent
Yuan et al.

(10) Patent No.: US 12,364,122 B2
(45) Date of Patent: Jul. 15, 2025

(54) ARRAY SUBSTRATE AND DISPLAY DEVICE

(71) Applicants: Hefei BOE Joint Technology Co., Ltd., Anhui (CN); BOE Technology Group Co., Ltd., Beijing (CN)

(72) Inventors: Can Yuan, Beijing (CN); Yongqian Li, Beijing (CN); Zhidong Yuan, Beijing (CN); Pan Xu, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 485 days.

(21) Appl. No.: 17/914,466

(22) PCT Filed: Nov. 19, 2021

(86) PCT No.: PCT/CN2021/131947
§ 371 (c)(1),
(2) Date: Sep. 26, 2022

(87) PCT Pub. No.: WO2022/166312
PCT Pub. Date: Aug. 11, 2022

(65) Prior Publication Data
US 2023/0122411 A1    Apr. 20, 2023

(30) Foreign Application Priority Data
Feb. 5, 2021   (CN) .......................... 202110162501.X (51) Int. Cl.
*H01L 29/08*    (2006.01)
*G09G 3/3266*    (2016.01)
(Continued)

(52) U.S. Cl.
CPC ......... *H10K 59/131* (2023.02); *G09G 3/3266* (2013.01); *H10K 50/813* (2023.02);
(Continued)

(58) Field of Classification Search
CPC ............... H10K 59/131; H10K 59/126; H10K 59/1216; H10K 50/824; H10K 50/813; G09G 3/3266; G09G 2300/0426
(Continued)

(56) References Cited

U.S. PATENT DOCUMENTS 7,782,275 B2    8/2010    Kim et al.
10,585,320 B2    3/2020    Xu et al.
(Continued)

FOREIGN PATENT DOCUMENTS

CN    102768991 A    11/2012
CN    104064688 A    9/2014
(Continued)

OTHER PUBLICATIONS

Cite the machine translation Li P (CN-210073855-U).*
(Continued)

*Primary Examiner* — Phuc T Dang
(74) *Attorney, Agent, or Firm* — XSENSUS LLP (57) ABSTRACT

The present disclosure provides an array substrate and a display device. The array substrate includes a base substrate and a scan line, a data line, a power supply line, a sensing line, a pixel driving circuit and a light-emitting unit that are sequentially stacked on the base substrate. The array substrate also includes a gate layer, a first conductive layer, a second conductive layer, and a third conductive layer. The first electrode of the storage capacitor is at least disposed at the first conductive layer, and the second electrode of the storage capacitor is at least disposed at the second conductive layer. The data line, the power supply line, and the sensing line are disposed at the third conductive layer.

20 Claims, 9 Drawing Sheets

(51) Int. Cl.
*H10K 50/813* (2023.01)
*H10K 50/824* (2023.01)
*H10K 59/121* (2023.01)
*H10K 59/126* (2023.01)
*H10K 59/131* (2023.01)

(52) U.S. Cl.
CPC ....... *H10K 50/824* (2023.02); *H10K 59/1216* (2023.02); *H10K 59/126* (2023.02); *G09G 2300/0426* (2013.01)

(58) Field of Classification Search
USPC .......................................................... 257/40
See application file for complete search history.

(56) References Cited

U.S. PATENT DOCUMENTS

| | | |
|---|---|---|
| 2006/0151745 A1 | 7/2006 | Kim et al. |
| 2014/0034952 A1 | 2/2014 | Chen |
| 2017/0193876 A1* | 7/2017 | Choi .................... H10K 59/131 |
| 2018/0033850 A1 | 2/2018 | Gang et al. |
| 2019/0250451 A1 | 8/2019 | Xu et al. |
| 2021/0134899 A1 | 5/2021 | Peng et al. |
| 2021/0193766 A1* | 6/2021 | Liu .................... H10K 59/1213 |

FOREIGN PATENT DOCUMENTS

| | | | | |
|---|---|---|---|---|
| CN | 104681582 A | 6/2015 | | |
| CN | 108269810 A | 7/2018 | | |
| CN | 108363253 A | 8/2018 | | |
| CN | 109309122 A | 2/2019 | | |
| CN | 110459561 A | 11/2019 | | |
| CN | 110757696 A | 2/2020 | | |
| CN | 110808340 A | 2/2020 | | |
| CN | 210073855 U | * 2/2020 | ......... | H01L 27/3262 |
| CN | 111179855 A | 5/2020 | | |
| CN | 111341814 A | 6/2020 | | |
| CN | 111816686 A | 10/2020 | | |
| CN | 112909065 A | 6/2021 | | |
| KR | 10-2006-0064129 A | 6/2006 | | |
| WO | WO-2020159045 A1 | * 8/2020 | ............. | H05K 1/189 |

OTHER PUBLICATIONS

Cite the machine translation Hwang S (WO-2020159045-A1).*
Office Action issued on Jun. 1, 2023, in corresponding Chinese patent Application No. 202110162501.X, 18 pages.
International Search Report and Written Opinion issue Feb. 11, 2022, in corresponding International Application No. PCT/CN2021/131947.

* cited by examiner

ARRAY SUBSTRATE AND DISPLAY DEVICE

CROSS REFERENCE

The present application is based upon International Application No. PCT/CN2021/131947, filed on Nov. 19, 2021, which is based upon and claims priority to Chinese Patent Application No. 202110162501.X, filed on Feb. 5, 2021, and entitled "ARRAY SUBSTRATE AND DISPLAY DEVICE", and the entire contents thereof are incorporated herein by reference.

TECHNICAL FIELD

The present disclosure relates to the field of display technology, and in particular, to an array substrate and a display device.

BACKGROUND

OLED (Organic Light Emitting Diode) display technology is recognized as the third-generation display technology by the industry due to its advantages of lightness and thinness, self-luminescence, wide viewing angle, fast response speed, low brightness, and low power consumption. It has been widely used in the field of high-performance display.

SUMMARY

The present disclosure provides an array substrate and a display device.

According to one aspect, the present disclosure provides an array substrate including a base substrate and a scan line, a data line, a power supply line, a sensing line, a pixel driving circuit and a light-emitting unit stacked on the base substrate in sequence, the pixel driving circuit including a driving transistor and a storage capacitor, the storage capacitor including a first electrode and a second electrode, a first electrode of the driving transistor being electrically connected to the power supply line, a second electrode of the driving transistor being electrically connected to the light-emitting unit, and a gate electrode of the driving transistor being electrically connected to the second electrode of the storage capacitor, wherein the array substrate includes:

a gate layer, disposed at the base substrate, wherein the scan line and the gate electrode of the driving transistor are disposed at the gate layer;

a first conductive layer, disposed at a side of the gate layer away from the base substrate, wherein the first electrode of the storage capacitor is at least disposed at the first conductive layer;

a second conductive layer, disposed as a side of the first conductive layer away from the gate layer, wherein the second electrode of the storage capacitor is at least disposed at the second conductive layer; and a third conductive layer, disposed at a side of the second conductive layer away from the first conductive layer, wherein the data line, the power supply line and the sensing line are disposed at the third conductive layer.

In an exemplary embodiment of the present disclosure, the array substrate further includes an active layer disposed between the base substrate and the gate layer, wherein the first electrode of the storage capacitor includes a first electrode plate and a second electrode plate, the first electrode plate is disposed at the first conductive layer, the second electrode plate is disposed at the gate layer, the first electrode plate and the second electrode plate are electrically connected through a via hole, and the second electrode plate is further electrically connected with the gate electrode of the driving transistor;

the second electrode of the storage capacitor includes a third electrode plate and a fourth electrode plate, the third electrode plate is disposed at the second conductive layer, and the fourth electrode plate is at least disposed a side of the active layer away from the gate layer, the third electrode plate and the fourth electrode plate are electrically connected through a via hole, and the third electrode plate is further electrically connected with the light-emitting unit;

wherein projections of the first electrode plate and the third electrode plate on the base substrate overlap to form a first storage capacitor, projections of the first electrode plate and the fourth electrode plate on the base substrate overlap to form a second storage capacitor; and projections of the second electrode plate and the fourth electrode plate on the base substrate overlap to form a third storage capacitor; and the first storage capacitor, the second storage capacitor and the third storage capacitor are connected in parallel to form the storage capacitor.

In an exemplary embodiment of the present disclosure, the gate electrode of the driving transistor is multiplexed into the second electrode plate.

In an exemplary embodiment of the present disclosure, the array substrate further includes a light-shielding layer, disposed at the side of the active layer away from the gate layer, and having a projection on the base substrate overlapped with the gate electrode of the driving transistor.

In an exemplary embodiment of the present disclosure, light-shielding layer is multiplexed into the fourth electrode plate.

In an exemplary embodiment of the present disclosure, the array substrate further includes:

a buffer layer, disposed between the active layer and the light-shielding layer, and a via hole is disposed in the buffer layer;

a first interlayer dielectric layer, disposed between the active layer and the first conductive layer, and a via hole is disposed in the first interlayer dielectric layer; and a second interlayer dielectric layer, disposed between the first conductive layer and the second conductive layer, and a via hole is disposed in the second interlayer dielectric layer;

wherein the third electrode plate and the fourth electrode plate are connected through via holes in the buffer layer, the first interlayer dielectric layer and the second interlayer dielectric layer.

In an exemplary embodiment of the present disclosure, the via holes in the buffer layer and the first interlayer dielectric layer are formed by one patterning process using a halftone mask.

the scan line includes a first scan line; and the array substrate further includes a second transistor, a gate electrode of the second transistor is electrically connected to the first scan line, a first electrode of the second transistor is electrically connected to the data line, and a second electrode of the second transistor is electrically connected to the gate electrode of the driving transistor.

In an exemplary embodiment of the present disclosure, the scan electrode further includes a second scan line; and the array substrate further includes a third transistor, a gate electrode of the third transistor is electrically connected to the second scan line, a first electrode of the third transistor is multiplexed into the second electrode of the driving transistor, and a second electrode of the third transistor is electrically connected to the sensing line.

In an exemplary embodiment of the present disclosure, the array substrate further includes:

a sensing connecting part, disposed at the second conductive layer, and is electrically connected with the second electrode of the third transistor through a via hole; and wherein the sensing connecting part is further electrically connected with the sensing line through a via hole.

In an exemplary embodiment of the present disclosure, a third interlayer dielectric layer and a first planarizing layer are disposed between the second conductive layer and the third conductive layer, via holes are disposed in the third interlayer dielectric layer and the first planarizing layer, and the sensing connecting part and the sensing line are electrically connected through the via holes in the third interlayer dielectric layer and the first planarizing layer.

In an exemplary embodiment of the present disclosure, the via holes in the third interlayer dielectric layer and the first planarizing layer are formed by one patterning process using a halftone mask.

In an exemplary embodiment of the present disclosure, the light-emitting unit includes a cathode layer and an anode layer disposed opposite to each other, and an organic light emitting layer disposed between the cathode layer and the anode layer, the anode layer is disposed at a side of the third conductive layer away from the base substrate, and the cathode layer is disposed at a side of the anode layer away from the base substrate; the array substrate further includes:

an auxiliary cathode layer, disposed between the anode layer and the third conductive layer, and is electrically connected to the cathode layer.

In an exemplary embodiment of the present disclosure, a via hole is disposed in the auxiliary cathode layer, and the array substrate further includes:

an insulating layer, disposed between the third conductive layer and the light-emitting unit, and a via hole is disposed in the insulating layer;

a second planarizing layer, disposed between the insulating layer and the light-emitting unit, and a via hole is disposed in the second planarizing layer;

wherein the anode layer is electrically connected to a drain electrode of the driving transistor through at least the via holes disposed in the auxiliary cathode layer, the insulating layer, and the second planarizing layer.

In an exemplary embodiment of the present disclosure, the via holes in the insulating layer and the second planarizing layer are formed by one patterning process using a halftone mask.

According to another aspect of the present disclosure, there is provided a display device including the above array substrate.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Obviously, the drawings in the following description are only some embodiments of the present disclosure, and for those of ordinary skill in the art, other drawings can also be obtained from these drawings without creative effort.

DETAILED DESCRIPTION

Example embodiments will now be described more fully with reference to the accompanying drawings. Example embodiments, however, can be embodied in various forms and should not be construed as limited to the embodiments set forth herein; rather, these embodiments are provided so that this disclosure will be thorough and complete, and will fully convey the concept of example embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

Although relative terms such as "upper" and "lower" are used in this specification to describe the relative relationship of one component of an icon to another component, these terms are used in this specification only for convenience, such as according to the direction of the example described. It will be appreciated that if the device shown in the drawing is turned upside down, the components described as "on" will become the components on "bottom". When a certain structure is "on" other structures, it may mean that the certain structure is integrally formed on the other structures, or that the certain structure is "directly" arranged on the other structures, or that the certain structure is "indirectly" arranged on the other structures through another structure.

The terms "a", "an", "the", "said" and "at least one" are used to indicate the presence of one or more elements/components/etc.; the terms "include" and "have" are used to indicate an open-ended inclusive, and means that additional elements/components/etc. may be present in addition to the listed elements/components/etc.; the terms "first", "second" and "third" etc. are only used as a marker, which are not limiting the number of its objects.

Figure 1:
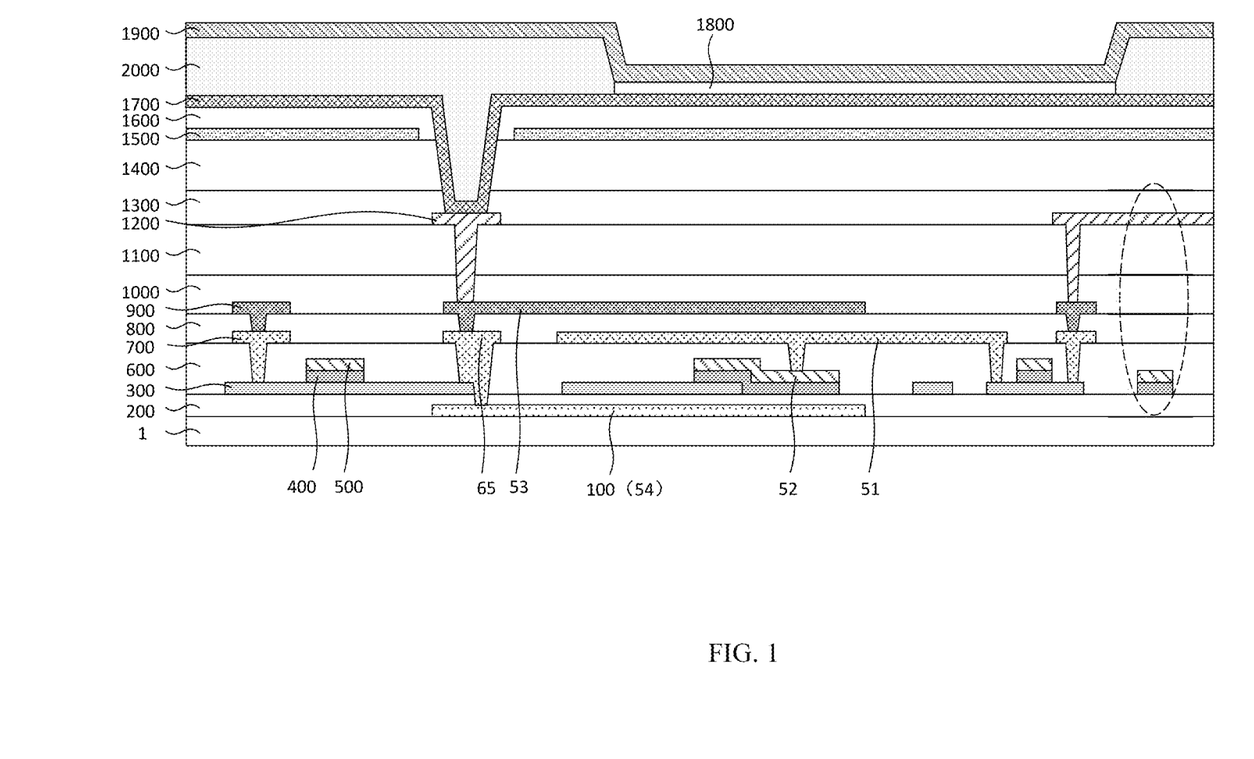
FIG. 1 is a schematic structural diagram of an array substrate in this embodiment.

Embodiments of the present disclosure provide an array substrate, referring to FIG. 1, the array substrate includes a base substrate 1 and a data line 20, a power supply line 30, a sensing line 40, a pixel driving circuit and a light emitting unit that are sequentially stacked on the base substrate 1. The pixel driving circuit includes a driving transistor T1 and a storage capacitor, the storage capacitor includes a first electrode and a second electrode, the first electrode of the driving transistor T1 is electrically connected to the power supply line 30, the second electrode of the driving transistor T1 is electrically connected to the light-emitting unit, and the gate electrode of the driving transistor T1 is electrically connected to the second electrode of the storage capacitor.

The array substrate includes a gate layer 500, a first conductive layer 700, a second conductive layer 900 and a third conductive layer 1200. The gate layer 500 is provided at the base substrate 1, and the gate electrode of the driving transistor is provided at the gate layer 500. The first conductive layer 700 is disposed on the side of the gate layer 500 away from the base substrate 1, and the first electrode of the storage capacitor is disposed at least at the first conductive layer 700. The second conductive layer 900 is disposed on the side of the first conductive layer 700 away from the gate layer 500, and the second electrode of the storage capacitor is disposed at least at the second conductive layer 900. The third conductive layer 1200 is disposed on the side of the second conductive layer 900 away from the first conductive layer 700, and the data line 20, the power supply line 30, and the sensing line 40 are disposed at the third conductive layer 1200.

In the present disclosure, a total of three conductive layers are disposed on the gate layer 500. The first conductive layer 700, the second conductive layer 900 and the third conductive layer 1200 can be regarded as the first source-drain layer, the second source-drain layer and the third source-drain layer, respectively. The first conductive layer 700 and the second conductive layer 900 are used to dispose the storage capacitor, and the third conductive layer 1200 is used to dispose the data line 20, the power supply line 30, and the sensing line 40. Sufficient wiring space is provided for the signal lines, to meet the driving refresh rate requirements while reducing the resistance of the data line 20 and the IR drop of the power source line 30. Compared with disposing all the above structures in one or two conductive layers, the restriction of wiring space is greatly reduced. For display products with a horizontal fixed size, it can provide higher pixel PPI, especially suitable for product with ultra-high pixel PPI. In addition, the present disclosure separates the scan line from the data line 20, the power supply line 30, and the sensing lines 40, which not only reduces the load, but also reduces the probability of short circuit between layers, thereby improving the product yield.

Hereinafter, the array substrate according to the embodiment of the present disclosure will be described in detail.

Figure 2:
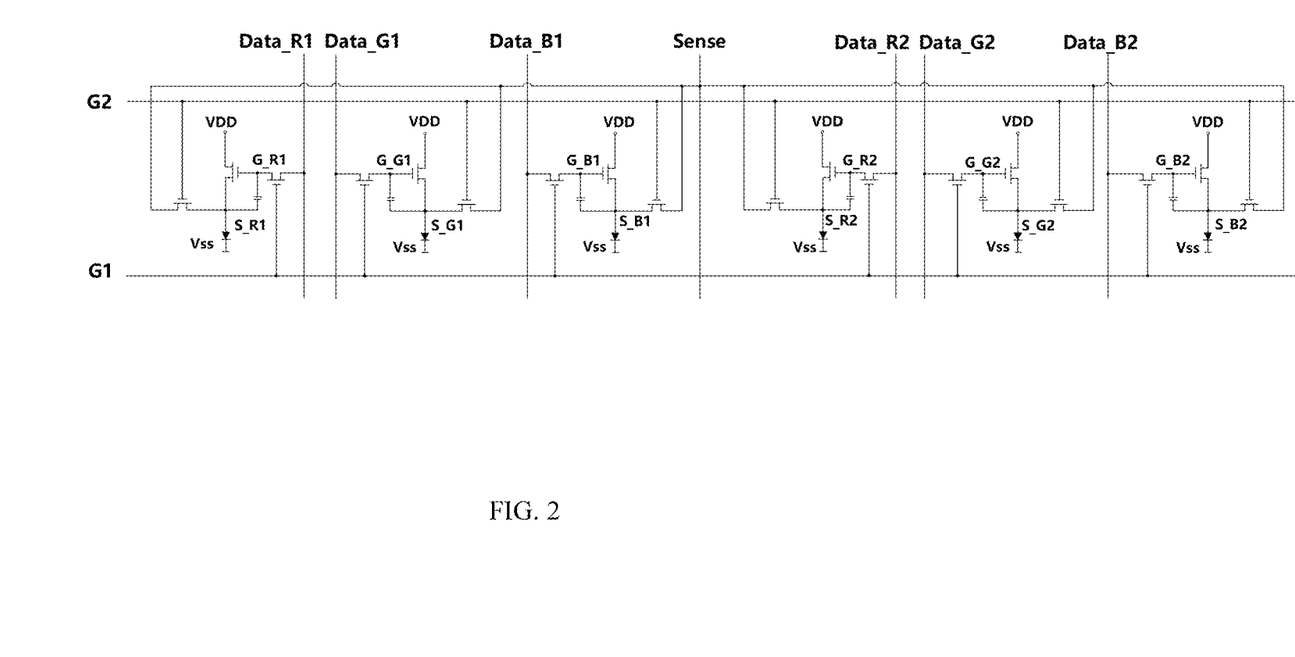
FIG. 2 is the 3T1C circuit structure of two pixel units.
Figure 3:
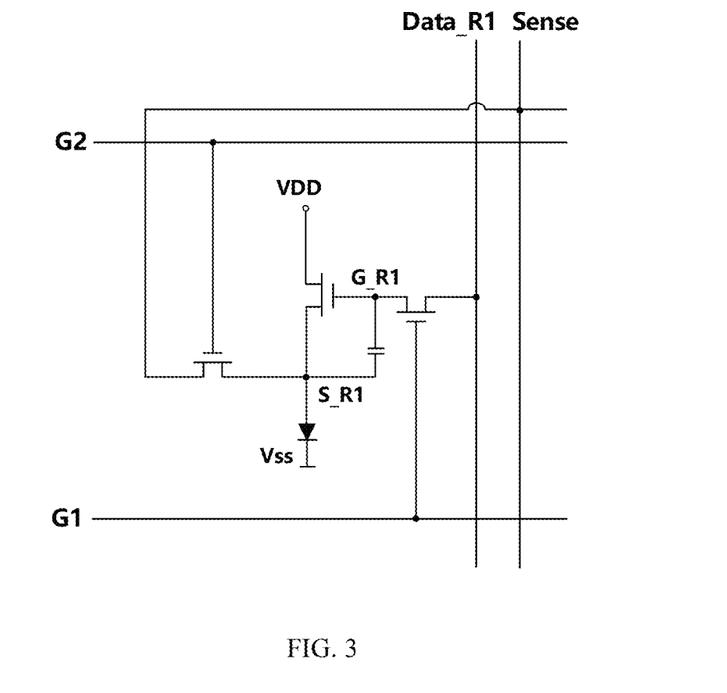
FIG. 3 is the 3T1C circuit structure of one sub-pixel.

Referring to FIG. 2 and FIG. 3, FIG. 2 shows a 3T1C circuit structure of two pixel units, and FIG. 3 shows a 3T1C circuit structure of one sub-pixel. The sub-pixel circuit structure includes a capacitor and three TFT transistors T1-T9. In this embodiment, all TFTs are N-type TFTs, wherein the first transistor T1 is a driving transistor, and the other transistors are switching transistors.

The capacitor includes a first electrode Cst1 and a second electrode Cst2, the first electrode Cst1 is connected to the node N1, and the second electrode Cst2 is connected to the node N2. The gate electrode 1g of the driving transistor T1 (the first transistor) is connected to the node N1, the source electrode is of the driving transistor T1 is connected to the power supply line 30 (vdd), and the drain electrode 1d of the driving transistor T1 is connected to the node N2. The gate electrode 2g of the second transistor T2 is connected to the first scan line 11 (G1), the source electrode 2s of the second transistor T2 is connected to the data line 20 (data), and the drain electrode 2d of the second transistor T2 is connected to the node N1. The gate electrode 3g of the third transistor T3 is connected to the second scan line 12 (G2), the source electrode 3s of the third transistor T3 is connected to the node N2, and the drain electrode 3d of the third transistor T3 is connected to the sense line 40 (sense).

Referring to FIG. 2, each pixel unit includes three sub-pixels, corresponding to a red sub-pixel, a green sub-pixel and a blue sub-pixel respectively. The gate electrodes 2g of the six second transistors T2 in the six sub-pixel circuit structures are commonly connected to the same first scan line 11 (G1), and the gate electrodes 3g of the six third transistors T3 are commonly connected to the same second scan line 12 (G2), the drain electrodes 3d of the six third transistors T3 are commonly connected to the same sensing line 40 (sense).

In this embodiment, the sub-pixel driving circuits of the above-mentioned sub-pixels are formed on a base substrate 1. Referring to FIG. 1, an active layer 300, a gate layer 500, a first conductive layer 700, a second conductive layer 900, and a third conductive layer 1200 are sequentially stacked on the base substrate 1 from bottom to top, and a light-emitting unit is further disposed on the third conductive layer 1200. In the present disclosure, an OLED light-emitting device is taken as an example, including an anode layer 1700, an organic light-emitting layer 1800, and a cathode layer 1900 that are sequentially stacked from bottom to top. The two film layers are insulated by insulating materials. For example, a gate insulating layer 400 is disposed between the active layer 300 and the gate layer 500, and a first interlayer dielectric layer 600 is disposed between the gate insulating layer 400 and the first conductive layer 700, a second interlayer dielectric layer 800 is disposed between the first conductive layer 700 and the second conductive layer 900, and a third interlayer dielectric layer 1000 is provided between the second conductive layer 900 and the third conductive layer 1200. An insulating layer is disposed between the third conductive layer 1200 and the anode layer 1700. A buffer layer 200 is further disposed under the active layer 300 for protecting the base substrate 1. The array substrate further includes a light-shielding layer 100, which is located on the side of the active layer 300 away from the gate layer 500, specifically between the buffer layer 200 and the base substrate 1. The projection of the light-shielding layer 100 on the base substrate 1 is overlapped with the gate electrode of the driving transistor T1, to prevent ambient light from the backside from affecting the drive transistor T1. The OLED light-emitting devices of each sub-pixel are spaced apart by the pixel defining layer 2000.

Figure 15:
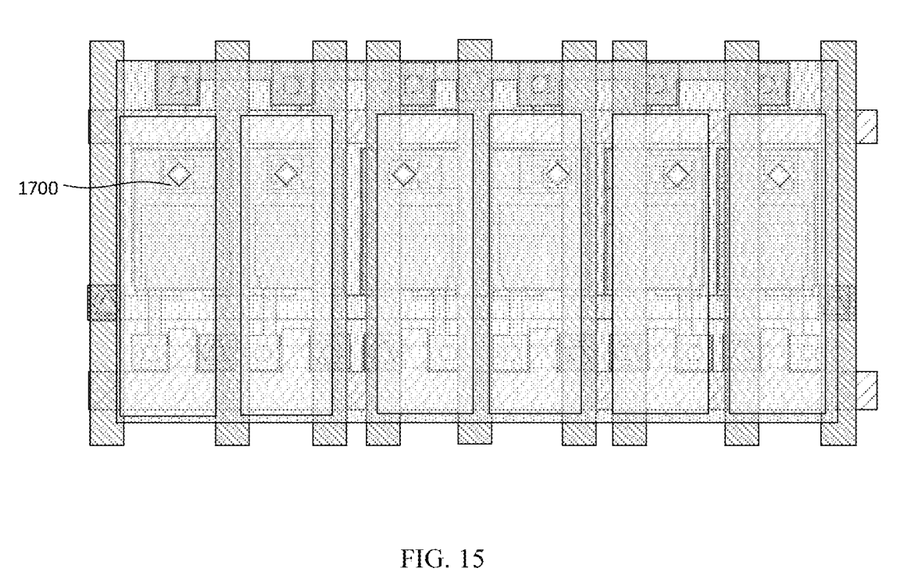
FIG. 15 is a schematic structural diagram of the anode layer.
Figure 16:
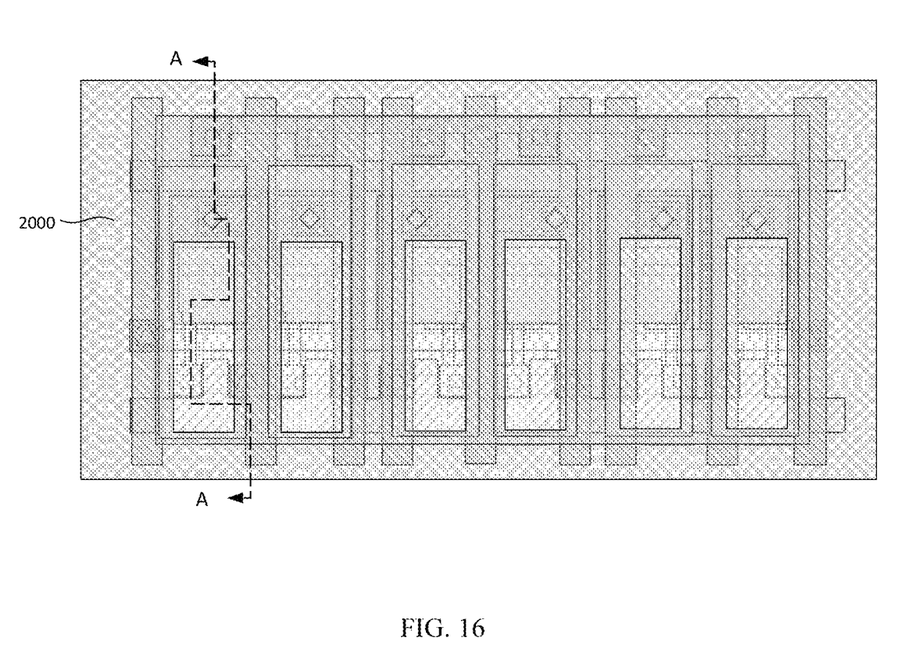
FIG. 16 is a schematic structural diagram of the pixel defining layer.

FIGS. 4-16 are schematic diagrams showing the stacking of each film layer in sequence, and FIG. 1 is a schematic cross-sectional view along the A-A direction in FIG. 16.

Figure 4:
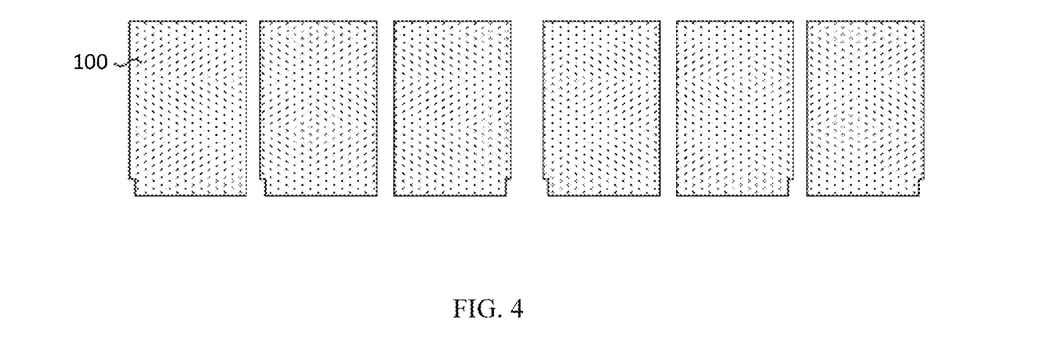
FIG. 4 is a schematic structural diagram of the light-shielding layer.
Figure 5:
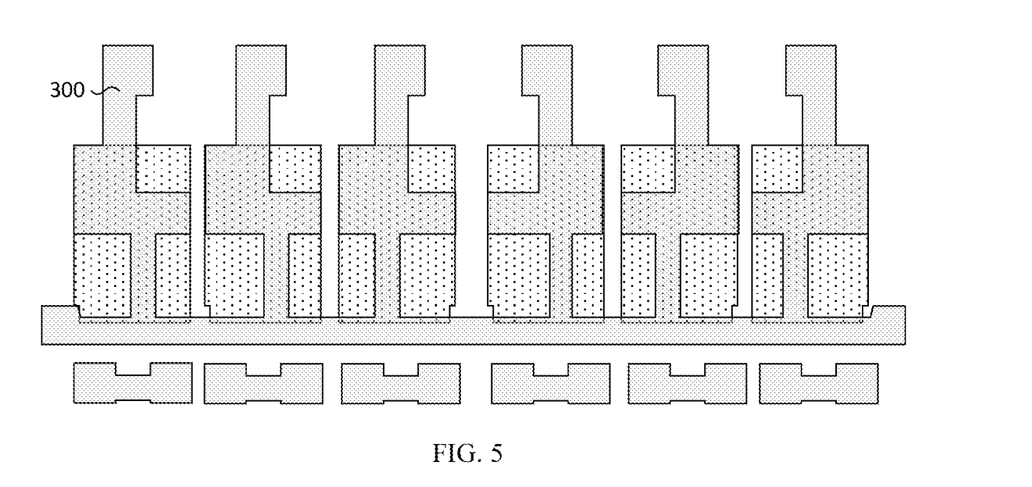
FIG. 5 is a schematic structural diagram of the active layer.
Figure 6:
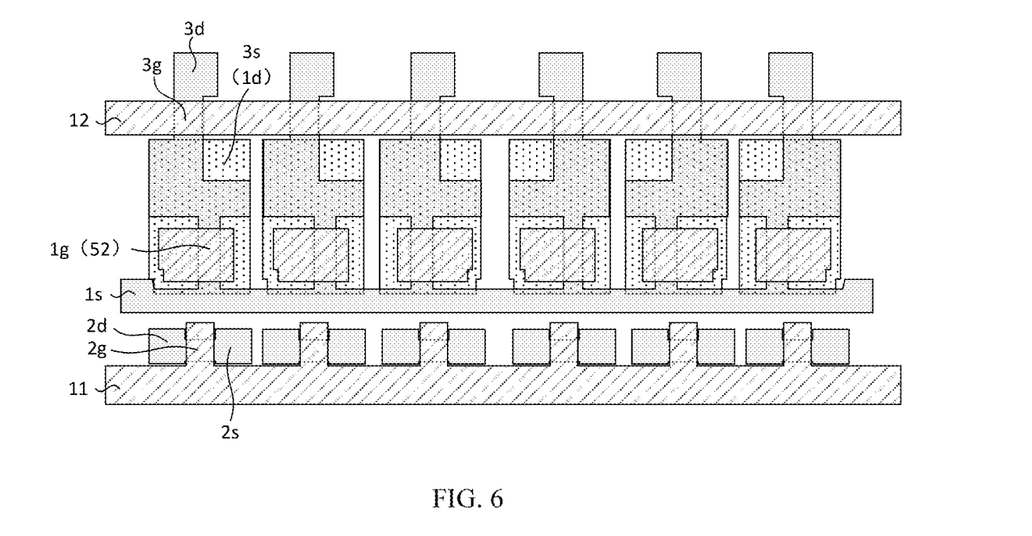
FIG. 6 is a schematic structural diagram of the gate layer.

FIG. 4 is a schematic structural diagram of the light-shielding layer 100. FIG. 5 is a schematic structural diagram of the active layer 300. The active layer 300 is used to dispose the channel region (1g-3g), the first electrode (1s-3s) and the second electrode (1d-3d) of each TFT transistor. Referring to FIG. 6 which is a schematic diagram of the structure of the gate layer 500, the gate layer 500 is used to dispose the gate electrode (e.g., 1g-3g) forming each transistor in the sub-pixel driving circuit, as well as the first scan line 11 and the second scan line 12. The first scan line 11 and the second scan line 12 are arranged at intervals in the column direction and extended in the row direction, and are used for providing scan signals to each sub-pixel located in the same row in the row direction. In this embodiment, the first scan line 11 is located below the sub-pixel area, and the second scan line 12 is located above the sub-pixel area. In this embodiment, the gate electrode 1g of the driving transistor T1 is multiplexed as the second electrode plate 52 of the storage capacitor.

Figure 7:
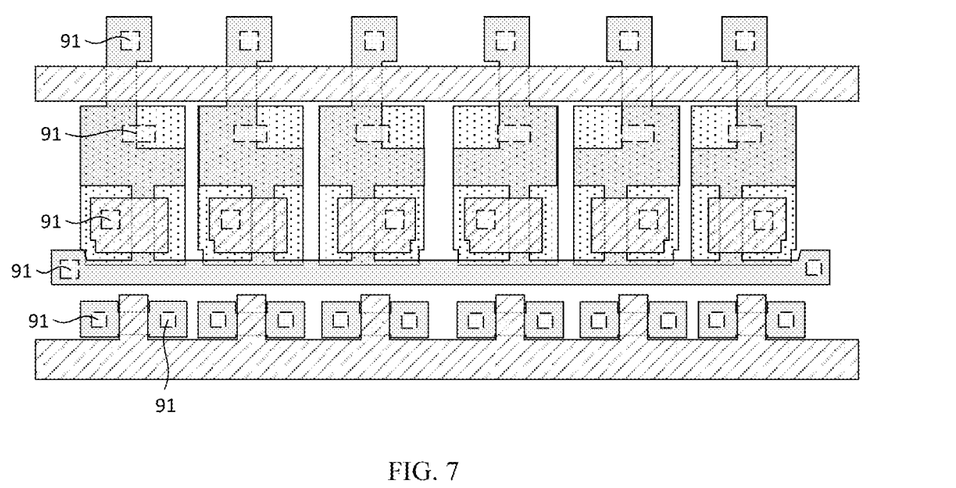
FIG. 7 is a schematic diagram of the via hole on the first interlayer dielectric layer.
Figure 8:
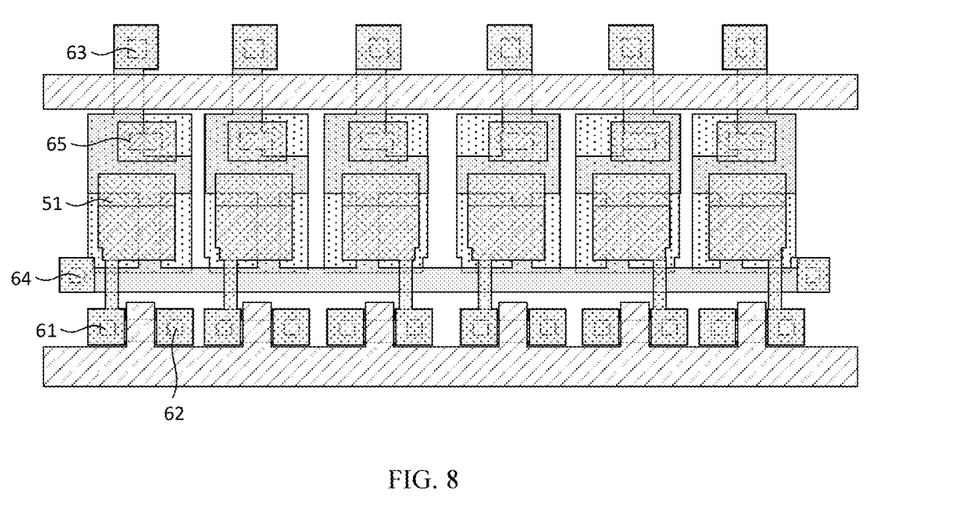
FIG. 8 is a schematic structural diagram of the first conductive layer.

FIG. 7 shows the via holes 91 disposed in the first interlayer dielectric layer 600. The first interlayer dielectric layer is a transparent film layer, so only the positions of the via holes are shown in the figure. FIG. 8 shows a schematic structural diagram of the first conductive layer 700.

The first electrode plate 51 of the storage capacitor is disposed in the first conductive layer 700, and the first electrode plate 51 and the second electrode plate 52 are electrically connected through via holes to form the first electrode Cst1 of the storage capacitor.

The first conductive layer 700 is also provided with a first connecting part 61, one end of the first connecting part 61 is connected to the gate electrode 1g of the driving transistor T1, and the other end is connected to the drain electrode 2d of the second transistor through the via hole provided in the first interlayer dielectric layer 600, to connect the gate electrode 1g of the driving transistor T1 with the drain electrode 2d of the second transistor. The second connecting part 62 is connected to the source electrode 2s of the second transistor through a via hole provided in the first interlayer dielectric layer 600.

The first conductive layer 700 is also provided with a third connecting part 63 and a fourth connecting part 6, the third connecting part 63 is connected to the drain electrode 3d of the third transistor through a via hole provided in the first interlayer dielectric layer 600, and the fourth connecting part 64 is connected to the source electrode 1s of the driving transistor T1 through a via hole provided in the first interlayer dielectric layer 600.

The first conductive layer 700 is further provided with a fifth connecting part 65, the fifth connecting part 65 is connected to the drain electrode 1d of the driving transistor T1 through a via hole provided in the first interlayer dielectric layer 600, and is also connected to the light-shielding layer 100 through via holes provided in the first interlayer dielectric layer 600 and the buffer layer 200.

Figure 9:
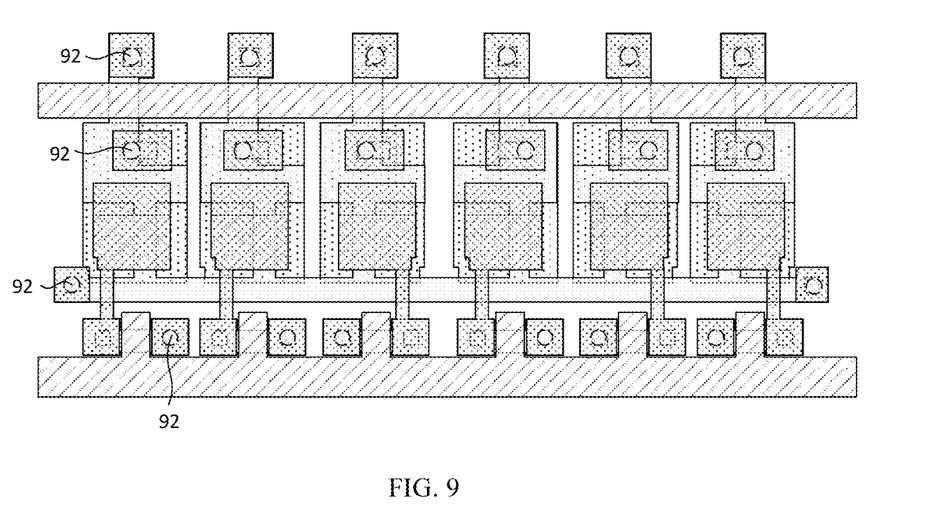
FIG. 9 is a schematic diagram of the via hole on the second interlayer dielectric layer.
Figure 10:
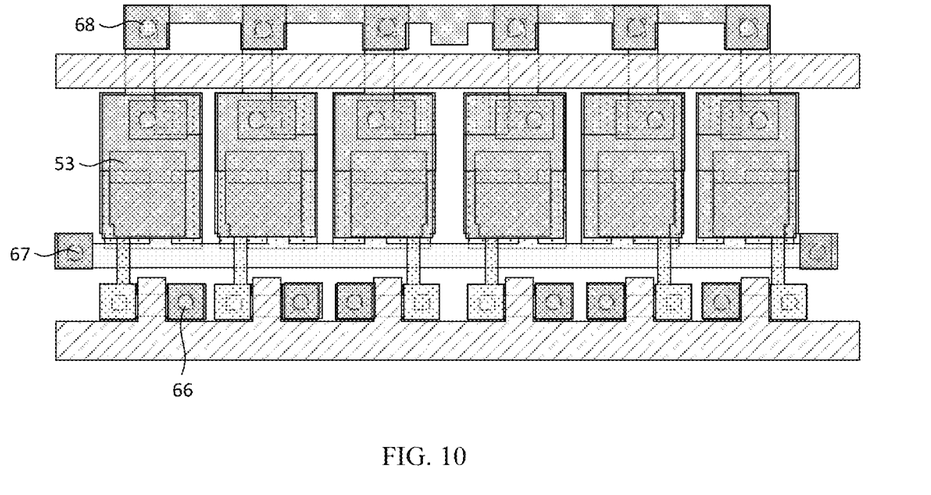
FIG. 10 is a schematic structural diagram of the second conductive layer.

FIG. 9 shows the via hole 92 provided in the second interlayer dielectric layer 800. FIG. 10 shows a schematic structural diagram of the second conductive layer 900.

The third electrode plate 53 of the storage capacitor is disposed in the second conductive layer 900. In this embodiment, the third electrode plate 53 is connected to the fifth connecting part 65 through the via hole provided in the second interlayer dielectric layer 800, so that the light-shielding layer 100 is connected to the third electrode plate 53, and so that the light-shielding layer 100 can be multiplexed into the fourth electrode plate 54. The third electrode plate 53 and the fourth electrode plate 54 are electrically connected through via holes to form the second electrode Cst2 of the storage capacitor. Since the light-shielding layer 100 needs to be multiplexed into the fourth electrode plate 54, the light-shielding layer 100 needs to have conductivity, and it can be made of conductive materials such as metal.

Among the above-mentioned four electrode plates, the projection of the first electrode plate 51 and the third electrode plate 53 on the base substrate 1 are overlapped to form the first storage capacitor; the projection of the first electrode plate 51 and the fourth electrode plate 54 on the base substrate 1 are overlapped to form the second storage capacitor; and the projection of the second electrode plate 52 and the fourth electrode plate 54 on the base substrate 1 are overlapped to form the third storage capacitor. The first storage capacitor, the second storage capacitor and the third storage capacitor are connected in parallel to form the storage capacitor, which can improve the storage effect of the capacitor.

The second conductive layer 900 is further provided with a sensing connecting part 68, and the sensing connecting part 68 is electrically connected to the second electrode 3d of the third transistor T3 through the via hole provided in the second interlayer dielectric layer 800. In this embodiment, the sensing connecting parts 68 of the six sub-pixels in every two pixel units are connected integrally and extend in the row direction as a whole.

A sixth connecting part 66 and a seventh connecting part 67 are further provided in the second conductive layer 900. The sixth connecting part 66 is connected to the second connecting part 62 through the via hole provided in the second interlayer dielectric layer 800, and the seventh connecting part 67 is connected to the fourth connecting part 64 through the via hole provided in the second interlayer dielectric layer 800.

Figure 11:
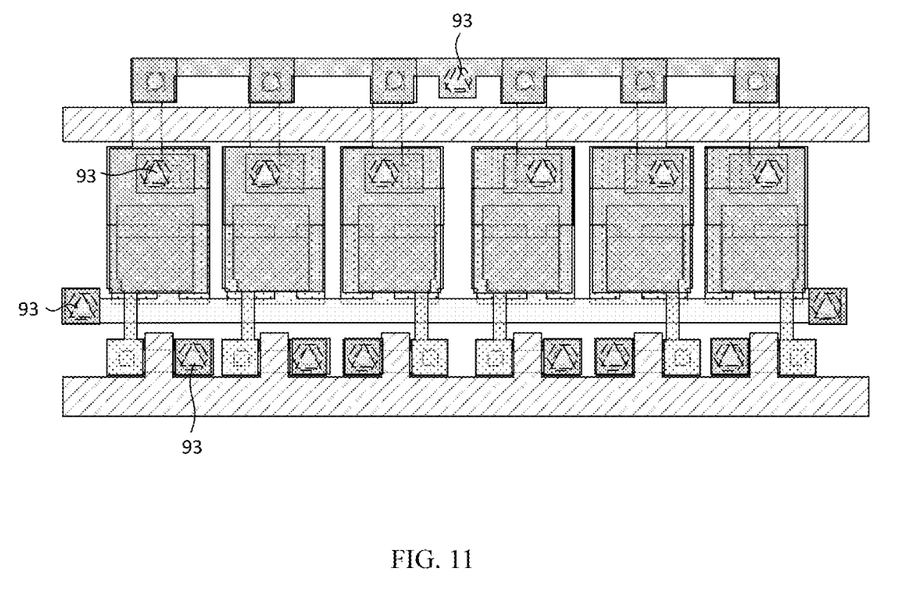
FIG. 11 is a schematic diagram of the via hole on the third interlayer dielectric layer and the first planarizing layer.
Figure 12:
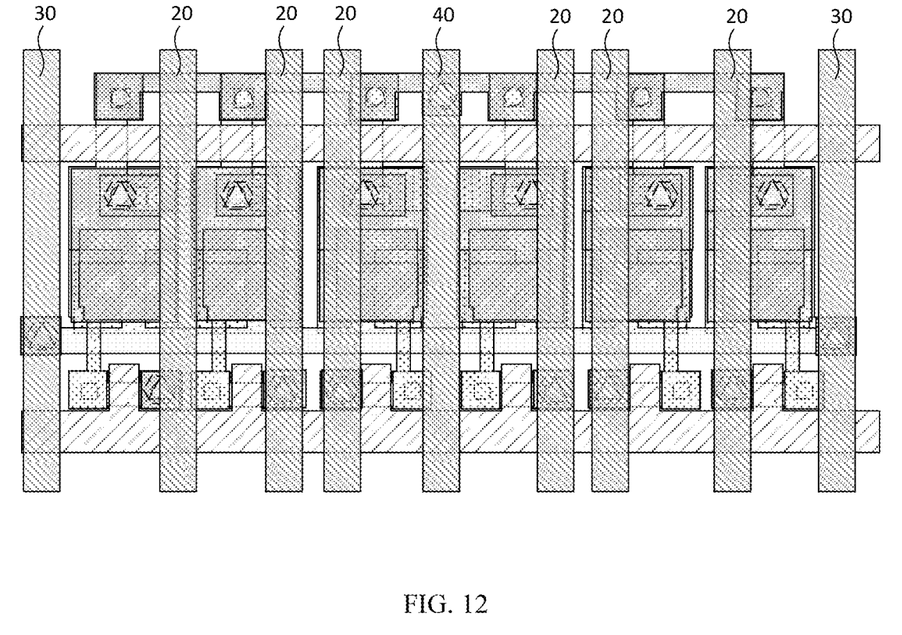
FIG. 12 is a schematic structural diagram of the third conductive layer.

FIG. 11 shows the via holes 93 provided in the first planarizing layer 1100 and the third interlayer dielectric layer 1000. FIG. 12 shows a schematic structural diagram of the third conductive layer 1200.

The data line 20, power supply line 30 and sensing line 40 are disposed in the third conductive layer 1200. The sensing line 40 and the sensing connecting part 68 are electrically connected through the via hole disposed in the third interlayer dielectric layer 1000, so that the second electrode of the third transistor is connected to the sensing line 40. The sensing connecting part 68 in every two pixel units are connected to the sensing line 40 through the via hole disposed in the third interlayer dielectric layer 1000. In this embodiment, the via hole is located between the two pixel units. The data line 20 is connected to the sixth connecting part 66 through the via hole provided in the third interlayer dielectric layer 1000, and then connected to the source electrode 2s of the second transistor through the second connecting part 62, so as to apply the data voltage to the second transistor. The power supply line 30 is connected to the seventh connecting part 67 through the via hole provided in the third interlayer dielectric layer 1000, and is further connected to the source electrode 1s of the driving transistor T1 via the fourth connecting part, so as to apply the power supply voltage to the driving transistor T1. In this embodiment, three sub-pixels in each pixel unit share one power supply line 30, and each sub-pixel corresponds to its own data line 20.

Further, a first planarizing layer 1100 is also provided between the second conductive layer 900 and the third conductive layer 1200, and a via hole is also provided in the first planarizing layer 1100. The respective structures in the second conductive layer 900 and the third conductive layer 1200 may realize electrical connection jointly by the via holes in the third interlayer dielectric layer 1000 and the via holes in the first planarizing layer 1100. The first planarizing layer 1100 can increase the thickness between the third conductive layer 1200 and the gate layer 500, which can reduce the overlap capacitance, and can also reduce the risk of short circuit and thus improve the yield.

It should be noted that since the positions of the via holes in the third interlayer dielectric layer 1000 and the first planarizing layer 1100 overlap, the via holes marked by 93 in FIG. 11 include a hexagonal via hole in the third interlayer dielectric layer 1000 and a triangular via hole in the first planarizing layer 1100. The via hole of the third interlayer dielectric layer 1000 and the via hole of the first planarizing layer 1100 can be formed by two etchings successively, or can be formed by one patterning process using a halftone mask, thereby reducing the number of photolithography.

Figure 13:
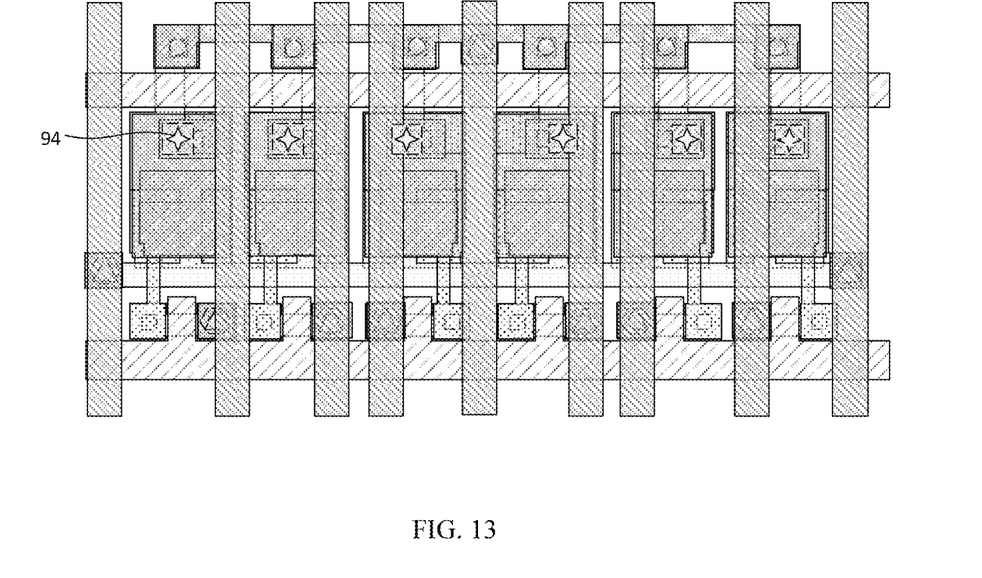
FIG. 13 is a schematic diagram of the via hole on the first insulating layer and the second planarizing layer.
Figure 14:
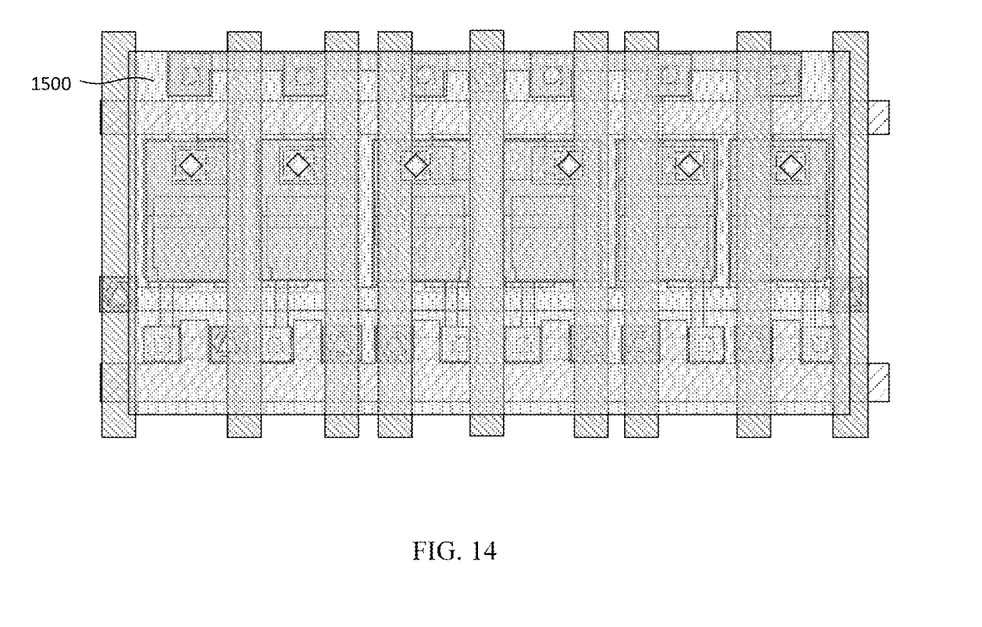
FIG. 14 is a schematic structural diagram of the auxiliary cathode layer.

FIG. 13 shows the via holes 94 provided in the first insulating layer 1300 and the second planarizing layer 1400. FIG. 14 shows a schematic structural diagram of the auxiliary cathode layer 1500. FIG. 15 shows a schematic structural diagram of the anode layer 1700. FIG. 16 shows a schematic structural diagram of the pixel defining layer 2000.

The array substrate further includes an auxiliary cathode layer 1500, which is disposed between the anode layer 1700 and the third conductive layer 1200, and is electrically connected to the cathode layer 1900 to reduce the resistance of the cathode layer 1900, thereby reducing the IR drop of vss.

A second insulating layer 1600 is disposed between the auxiliary cathode layer 1500 and the anode layer 1700. A first insulating layer 1300 and a second planarizing layer 1400 are disposed between the auxiliary cathode layer 1500 and the third conductive layer 1200. The first insulating layer 1300 and the second planarizing layer 1400 are provided with via holes 94, and the auxiliary cathode layer 1500 is also provided with a via hole. The anode layer 1700 is connected to the third electrode plate 53 through the via holes in the auxiliary cathode layer 1500, the first insulating layer 1300, and the second planarizing layer 1400, and then connected to the drain electrode 1$d$ of the driving transistor T1 through the fifth connecting part 65, so that the anode layer 1700 is connected to the drain electrode 1$d$ of the driving transistor T1. The design of the second planarizing layer 1400 can also reduce the overlap capacitance between the auxiliary cathode layer 1500 and the third conductive layer 1200, which can also reduce the risk of short circuit and improve the yield.

In another embodiment, the auxiliary cathode layer be omitted, and the anode layer 1700 is connected to the third electrode plate 53 through the via hole provided in the insulating layer, and then connected to the drain electrode 1$d$ of the driving transistor T1 through the fifth connecting part 65, so that the anode layer 1700 is connected to the drain electrode 1$d$ of the driving transistor T1.

In the array substrate shown in FIG. 1 of the present disclosure, the impedance load is reduced by about 40%, and the overlap capacitance between Gate and SD3 is also reduced accordingly (the impedance load is reduced by about 15%). While the impedance load is effectively reduced, the VDD IR Drop has also been reduced accordingly, providing technical support for large-size ultra-high PPI.

Hereinafter, the manufacturing method of the array substrate of the present disclosure is described, to form the array substrate shown in FIG. 1. The manufacturing method includes:

In step S100, the base substrate 1 is provided, and the light-shielding layer 100 and the buffer layer 200 covering the light-shielding layer 100 are formed on the base substrate 1.

In step S200, the active layer 300, the gate insulating layer 400 and the gate layer 500 are formed on the buffer layer 200 to form the driving transistor T1, the second transistor and the third transistor. The gate electrode 1$g$ of the driving transistor T1 is multiplexed as the second electrode plate 52 of the storage capacitor.

In step S300, the first interlayer dielectric layer 600 and the first conductive layer 700 are formed over the gate layer 500, so that the first conductive layer 700 includes the first electrode plate 51 of the storage capacitor, and the first electrode plate 51 and the second electrode plate are connected through the via hole in the first interlayer dielectric layer 600. The first conductive layer 700 further includes a fifth connecting part 65, and the fifth connecting part 65 is connected to the light-shielding layer 100 through the via hole in the first interlayer dielectric layer 600.

The first conductive layer 700 is further formed with a first connecting part 61 to a fifth connecting part 65. The first connecting part 61 is used to connect the gate electrode 1$g$ of the driving transistor T1 to the drain electrode 2$d$ of the second transistor; the second connecting part 62 is connected to the source electrode 2$s$ of the second transistor through a via hole provided in the first interlayer dielectric layer 600; the third connecting part 63 is connected to the drain electrode 3$d$ of the third transistor through the via hole provided in the first interlayer dielectric layer 600; the fourth connecting part is connected to source electrode is of the driving transistor T1 through the via hole provided in the first interlayer dielectric layer 600; and the fifth connecting part 65 is connected to the drain electrode 1$d$ of the driving transistor T1 through the via hole provided in the first interlayer dielectric layer 600, and is also connected to the light-shielding layer 100 through the via holes provided in the first interlayer dielectric layer 600 and the buffer layer 200.

In step S400, the second interlayer dielectric layer 800 and the second conductive layer 900 are formed over the first conductive layer 700, so that the second conductive layer 900 includes the third electrode plate 53 of the storage capacitor, so that the third electrode plate 53 is connected to the fifth connecting part 65 through the via hone in the second interlayer dielectric layer 800, and further connected to the light-shielding layer 100, wherein the light-shielding layer 100 is multiplexed as the fourth electrode plate 54 of the storage capacitor.

The first electrode plate 51 and the third electrode plate 53 form the first storage capacitor, the first electrode plate 51 and the fourth electrode plate 54 form the second storage capacitor, and the second electrode plate 52 and the fourth electrode plate 54 form the third storage capacitor. The first storage capacitor, the second storage capacitor and the third storage capacitor are connected in parallel to form the storage capacitor.

The second conductive layer 900 further includes the sensing connecting part 68, the sixth connecting part 66 and the seventh connecting part 67, and the sensing connecting part 68 is connected to the second electrode of the third transistor through the via hole in the first interlayer dielectric layer 600. The sixth connecting part 66 is connected to the second connecting part 62 through the via hole provided in the second interlayer dielectric layer 800, and the seventh connecting part 67 is connected to the fourth connecting part through the via hole provided in the second interlayer dielectric layer 800.

In step S500, the third interlayer dielectric layer 1000, the first planarizing layer 1100 and the third conductive layer 1200 are formed over the second conductive layer 900, so that the third conductive layer 1200 includes the data line 20, the power supply line 30 and the sensing line 40. The sensing line 40 is connected to the sensing connecting part 68 through the via holes in the third interlayer dielectric layer 1000 and the first planarizing layer 1100, and is further connected to the second electrode of the third transistor. The data line 20 is connected to the sixth connecting part 66 through via holes disposed in the third interlayer dielectric layer 1000 and the first planarizing layer 1100, and is further connected to the source electrode 2s of the second transistor through the second connecting part 62. The power supply line 30 is connected to the seventh connecting part 67 through via holes disposed in the third interlayer dielectric layer 1000 and the first planarizing layer 1100, and is further connected to the source electrode 1s of the driving transistor T1 through the fourth connecting part.

In step S600, the first insulating layer 1300, the second planarizing layer 1400, the auxiliary cathode layer 1500, and the second insulating layer 1600 are sequentially formed on the third conductive layer 1200, and via holes are formed in these layers. The light-emitting unit is then formed on the second insulating layer 1600, wherein the anode layer 1700 is connected to the third electrode plate 53 through the via holes in the auxiliary cathode layer 1500, the first insulating layer 1300, the second planarizing layer 1400, and the second insulating layer 1600. Further, the anode layer 1700 is connected to the drain electrode 1d of the driving transistor T1 via the fifth connecting part 65, so that the anode layer 1700 is connected to the drain electrode 1d of the driving transistor T1.

Afterwards, the pixel defining layer 2000 with an opening area is formed, the anode layer 1700 is exposed in the opening area, an organic light-emitting layer 1800 is formed in the opening area, and finally a cathode layer 1900 is formed, and the cathode layer 1900 is connected with the auxiliary cathode layer 1500.

In the process of progressively forming the structure shown in FIG. 1 according to the above steps, a total of 16 mask processes are required. In order to reduce the number of process steps, in step S300, the via holes may be formed through one etching process using a half-tone mask when forming the via holes in the first interlayer dielectric layer 600 and the buffer layer 200. In step S500, the via holes may be formed through one etching process using a half-tone mask when forming the via holes in the third interlayer dielectric layer 1000 and the first planarizing layer 1100. In step S600, the via holes may be formed through one etching process using a half-tone mask when forming the via holes in the first insulating layer 1300 and the second planarizing layer 1400.

Taking step S500 as an example, when a halftone mask is used for etching, a monolithic third interlayer dielectric layer 1000 is firstly formed by processes such as deposition, then a monolithic first planarizing layer 1100 is formed by processes such as printing, and finally via holes with different depths are formed at the positions where the via holes need to be formed by one photolithography process using the halftone mask.

By using the etching method, only 14 mask processes may be performed in the whole process, the manufacturing efficiency is improved, the number of mask plates is reduced, and the processing cost is lowered. Of course, the via holes on the two film layers may also be formed by successive etching in two steps.

It should be noted that although the various steps of the method of the present disclosure are described in a specific order in the drawings, this does not require or imply that the steps must be performed in the specific order, or that all the illustrated steps must be performed to achieve desired result. Additionally or alternatively, certain steps may be omitted, multiple steps may be combined into one step for execution, and/or one step may be decomposed into multiple steps for execution, and the like.

The present disclosure also provides a display device including the array substrate in the above embodiments. Since the display device includes the above-mentioned array substrate, it has the same beneficial effects, and details are not described here in the present disclosure.

This disclosure does not specifically limit the application of the display device, which can be a product or a part having flexible display function such as TV, notebook computer, tablet computer, wearable display device, mobile phone, in-vehicle display, navigation, e-book, digital photo frame, advertising light box, and the like.

Other embodiments of the present disclosure will readily occur to those skilled in the art upon consideration of the specification and practice of the invention disclosed herein. This application is intended to cover any variations, uses, or adaptations of the present disclosure that follow the general principles of the present disclosure and include common knowledge or techniques in the technical field not disclosed by the present disclosure. The specification and examples are to be regarded as exemplary only, with the true scope and spirit of the disclosure being indicated by the appended claims.

What is claimed is:

1. An array substrate comprising a base substrate and a scan line, a data line, a power supply line, a sensing line, a pixel driving circuit and a light-emitting unit stacked on the base substrate in sequence, the pixel driving circuit comprising a driving transistor and a storage capacitor, the storage capacitor comprising a first electrode and a second electrode, a first electrode of the driving transistor being electrically connected to the power supply line, a second electrode of the driving transistor being electrically connected to the light-emitting unit, and a gate electrode of the driving transistor being electrically connected to the second electrode of the storage capacitor, wherein the array substrate comprises:

a gate layer, disposed at the base substate, wherein the scan line and the gate electrode of the driving transistor are disposed at the gate layer;

a first conductive layer, disposed at a side of the gate layer away from the base substrate, wherein the first electrode of the storage capacitor is at least disposed at the first conductive layer;

a second conductive layer, disposed as a side of the first conductive layer away from the gate layer, wherein the second electrode of the storage capacitor is at least disposed at the second conductive layer; and a third conductive layer, disposed at a side of the second conductive layer away from the first conductive layer, wherein the data line, the power supply line and the sensing line are disposed at the third conductive layer.

2. The array substrate according to claim 1, further comprising an active layer disposed between the base substrate and the gate layer, wherein the first electrode of the storage capacitor comprises a first electrode plate and a second electrode plate, the first electrode plate is disposed at the first conductive layer, the second electrode plate is disposed at the gate layer, the first electrode plate and the second electrode plate are electrically connected through a via hole, and the second electrode plate is further electrically connected with the gate electrode of the driving transistor;

the second electrode of the storage capacitor comprises a third electrode plate and a fourth electrode plate, the third electrode plate is disposed at the second conductive layer, and the fourth electrode plate is at least disposed a side of the active layer away from the gate layer, the third electrode plate and the fourth electrode plate are electrically connected through a via hole, and the third electrode plate is further electrically connected with the light-emitting unit;

wherein projections of the first electrode plate and the third electrode plate on the base substrate overlap to form a first storage capacitor, projections of the first electrode plate and the fourth electrode plate on the base substrate overlap to form a second storage capacitor; and projections of the second electrode plate and the fourth electrode plate on the base substrate overlap to form a third storage capacitor; and the first storage capacitor, the second storage capacitor and the third storage capacitor are connected in parallel to form the storage capacitor.

3. The array substrate according to claim 2, wherein the gate electrode of the driving transistor is multiplexed into the second electrode plate.

4. The array substrate according to claim 3, further comprising a light-shielding layer, disposed at the side of the active layer away from the gate layer, and having a projection on the base substrate overlapped with the gate electrode of the driving transistor.

5. The array substrate according to claim 4, wherein the light-shielding layer is multiplexed into the fourth electrode plate.

6. The array substrate according to claim 5, wherein the array substrate further comprises:
   a buffer layer, disposed between the active layer and the light-shielding layer, and a via hole is disposed in the buffer layer;
   a first interlayer dielectric layer, disposed between the active layer and the first conductive layer, and a via hole is disposed in the first interlayer dielectric layer; and
   a second interlayer dielectric layer, disposed between the first conductive layer and the second conductive layer, and a via hole is disposed in the second interlayer dielectric layer;
   wherein the third electrode plate and the fourth electrode plate are connected through via holes in the buffer layer, the first interlayer dielectric layer and the second interlayer dielectric layer.

7. The array substrate according to claim 6, wherein the via holes in the buffer layer and the first interlayer dielectric layer are formed by one patterning process using a halftone mask.

8. The array substrate according to claim 5, wherein the scan line comprises a first scan line; and
   the array substrate further comprises a second transistor, a gate electrode of the second transistor is electrically connected to the first scan line, a first electrode of the second transistor is electrically connected to the data line, and a second electrode of the second transistor is electrically connected to the gate electrode of the driving transistor.

9. The array substrate according to claim 8, wherein the scan electrode further comprises a second scan line; and
   the array substrate further comprises a third transistor, a gate electrode of the third transistor is electrically connected to the second scan line, a first electrode of the third transistor is multiplexed into the second electrode of the driving transistor, and a second electrode of the third transistor is electrically connected to the sensing line.

10. The array substrate according to claim 9, further comprising:

a sensing connecting part, disposed at the second conductive layer, and is electrically connected with the second electrode of the third transistor through a via hole; and wherein the sensing connecting part is further electrically connected with the sensing line through a via hole.

11. The array substrate according to claim 5, wherein a third interlayer dielectric layer and a first planarizing layer are disposed between the second conductive layer and the third conductive layer, via holes are disposed in the third interlayer dielectric layer and the first planarizing layer, and the sensing connecting part and the sensing line are electrically connected through the via holes in the third interlayer dielectric layer and the first planarizing layer.

12. The array substrate according to claim 11, wherein the via holes in the third interlayer dielectric layer and the first planarizing layer are formed by one patterning process using a halftone mask.

13. The array substrate according to claim 5, wherein the light-emitting unit comprises a cathode layer and an anode layer disposed opposite to each other, and an organic light emitting layer disposed between the cathode layer and the anode layer, the anode layer is disposed at a side of the third conductive layer away from the base substrate, and the cathode layer is disposed at a side of the anode layer away from the base substrate; the array substrate further comprises:
   an auxiliary cathode layer, disposed between the anode layer and the third conductive layer, and is electrically connected to the cathode layer.

14. The array substrate according to claim 13, wherein a via hole is disposed in the auxiliary cathode layer, and the array substrate further comprises:
   an insulating layer, disposed between the third conductive layer and the light-emitting unit, and a via hole is disposed in the insulating layer;
   a second planarizing layer, disposed between the insulating layer and the light-emitting unit, and a via hole is disposed in the second planarizing layer;
   wherein the anode layer is electrically connected to a drain electrode of the driving transistor through at least the via holes disposed in the auxiliary cathode layer, the insulating layer, and the second planarizing layer.

15. The array substrate according to claim 14, wherein the via holes in the insulating layer and the second planarizing layer are formed by one patterning process using a halftone mask.

16. A display device comprising an array substrate, wherein the array substrate comprises:
   a base substrate and a scan line, a data line, a power supply line, a sensing line, a pixel driving circuit and a light-emitting unit stacked on the base substrate in sequence, the pixel driving circuit comprising a driving transistor and a storage capacitor, the storage capacitor comprising a first electrode and a second electrode, a first electrode of the driving transistor being electrically connected to the power supply line, a second electrode of the driving transistor being electrically connected to the light-emitting unit, and a gate electrode of the driving transistor being electrically connected to the second electrode of the storage capacitor;
   a gate layer, disposed at the base substate, wherein the scan line and the gate electrode of the driving transistor are disposed at the gate layer;

a first conductive layer, disposed at a side of the gate layer away from the base substrate, wherein the first electrode of the storage capacitor is at least disposed at the first conductive layer;

a second conductive layer, disposed as a side of the first conductive layer away from the gate layer, wherein the second electrode of the storage capacitor is at least disposed at the second conductive layer; and a third conductive layer, disposed at a side of the second conductive layer away from the first conductive layer, wherein the data line, the power supply line and the sensing line are disposed at the third conductive layer.

17. The display device according to claim 16, wherein the array substrate further comprises an active layer disposed between the base substrate and the gate layer, wherein the first electrode of the storage capacitor comprises a first electrode plate and a second electrode plate, the first electrode plate is disposed at the first conductive layer, the second electrode plate is disposed at the gate layer, the first electrode plate and the second electrode plate are electrically connected through a via hole, and the second electrode plate is further electrically connected with the gate electrode of the driving transistor;

the second electrode of the storage capacitor comprises a third electrode plate and a fourth electrode plate, the third electrode plate is disposed at the second conductive layer, and the fourth electrode plate is at least disposed a side of the active layer away from the gate layer, the third electrode plate and the fourth electrode plate are electrically connected through a via hole, and the third electrode plate is further electrically connected with the light-emitting unit;

wherein projections of the first electrode plate and the third electrode plate on the base substrate overlap to form a first storage capacitor, projections of the first electrode plate and the fourth electrode plate on the base substrate overlap to form a second storage capacitor; and projections of the second electrode plate and the fourth electrode plate on the base substrate overlap to form a third storage capacitor; and the first storage capacitor, the second storage capacitor and the third storage capacitor are connected in parallel to form the storage capacitor.

18. The display device according to claim 17, wherein the gate electrode of the driving transistor is multiplexed into the second electrode plate.

19. The display device according to claim 18, wherein the array substrate further comprises a light-shielding layer, disposed at the side of the active layer away from the gate layer, and having a projection on the base substrate overlapped with the gate electrode of the driving transistor.

20. The display device according to claim 19, wherein the light-shielding layer is multiplexed into the fourth electrode plate.

\* \* \* \* \*